(12) United States Patent
Takeuchi et al.

(10) Patent No.: US 11,569,368 B2
(45) Date of Patent: Jan. 31, 2023

(54) METHOD FOR MAKING SEMICONDUCTOR DEVICE INCLUDING A SUPERLATTICE AND PROVIDING REDUCED GATE LEAKAGE

(71) Applicant: Atomera Incorporated, Los Gatos, CA (US)

(72) Inventors: Hideki Takeuchi, San Jose, CA (US); Yung-Hsuan Yang, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 16/898,564

(22) Filed: Jun. 11, 2020

(65) Prior Publication Data

US 2021/0391446 A1    Dec. 16, 2021

(51) Int. Cl.
*H01L 29/66*      (2006.01)
*H01L 21/762*     (2006.01)
(Continued)

(52) U.S. Cl.
CPC .... *H01L 29/66431* (2013.01); *H01L 21/0206* (2013.01); *H01L 21/26513* (2013.01); *H01L 21/76224* (2013.01); *H01L 29/1054* (2013.01)

(58) Field of Classification Search
CPC .............. H01L 29/1054; H01L 29/152; H01L 29/7833; H01L 21/823807; H01L 29/15;
(Continued)

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| GB | 2347520 | 6/2000 |
| WO | 2012071988 | 6/2012 |

OTHER PUBLICATIONS

U.S. Appl. No. 16/176,005, filed Oct. 31, 2018 Weeks et al.
(Continued)

*Primary Examiner* — Bac H Au
(74) *Attorney, Agent, or Firm* — Allen, Dyer, Doppelt + Gilchrist, P.A.

(57) ABSTRACT

A method for making a semiconductor device may include forming shallow trench isolation (STI) regions in a semiconductor substrate defining an active region therebetween in the semiconductor substrate and a pad oxide on the active region. The method may further include removing at least some of the pad oxide, cleaning the active region to expose an upper surface thereof and define rounded shoulders of the active region adjacent the STI regions having an interior angle of at least 125°, and forming a superlattice on the active region. The superlattice may include a plurality of stacked groups of layers, each group of layers including a plurality of stacked base semiconductor monolayers defining a base semiconductor portion, and at least one non-semiconductor monolayer constrained within a crystal lattice of adjacent base semiconductor portions. The method may further include forming a semiconductor circuit including the superlattice.

18 Claims, 13 Drawing Sheets

(51) Int. Cl.
  *H01L 21/265* (2006.01)
  *H01L 29/10* (2006.01)
  *H01L 21/02* (2006.01)

(58) Field of Classification Search
  CPC .......... H01L 29/1083; H01L 21/02507; H01L 21/823878; H01L 21/76224; H01L 21/76283; H01L 21/0206
  See application file for complete search history.

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 5,858,857 A * | 1/1999 | Ho | H01L 21/76232 257/E21.549 |
| 5,920,787 A * | 7/1999 | Haskell | H01L 21/31612 257/E21.252 |
| 6,090,684 A * | 7/2000 | Ishitsuka | H01L 21/76232 257/E21.549 |
| 6,141,361 A | 10/2000 | Mears et al. | |
| 6,242,323 B1 * | 6/2001 | Ishitsuka | H01L 21/76232 438/424 |
| 6,376,337 B1 | 4/2002 | Wang et al. | |
| 6,472,685 B2 | 10/2002 | Takagi | |
| 6,559,027 B2 * | 5/2003 | Ishitsuka | H01L 21/76232 438/424 |
| 6,741,624 B2 | 5/2004 | Mears et al. | |
| 6,764,920 B1 * | 7/2004 | Yang | H01L 21/76224 438/424 |
| 6,821,857 B1 * | 11/2004 | Khan | H01L 21/26586 257/296 |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,905,921 B1 * | 6/2005 | Liu | H01L 21/26513 438/197 |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,899,479 B2 | 2/2018 | Mears et al. | |
| 9,941,359 B2 | 4/2018 | Mears et al. | |
| 9,972,685 B2 | 5/2018 | Mears et al. | |
| 10,084,045 B2 | 9/2018 | Mears et al. | |
| 10,107,854 B2 | 10/2018 | Roy | |
| 10,109,342 B2 | 10/2018 | Roy | |
| 10,109,479 B1 | 10/2018 | Mears et al. | |
| 10,170,560 B2 | 1/2019 | Mears | |
| 10,170,603 B2 | 1/2019 | Mears et al. | |
| 10,170,604 B2 | 1/2019 | Mears et al. | |
| 10,191,105 B2 | 1/2019 | Roy | |
| 10,249,745 B2 | 4/2019 | Mears et al. | |
| 10,276,625 B1 | 4/2019 | Mears et al. | |
| 10,304,881 B1 | 5/2019 | Chen et al. | |
| 10,355,151 B2 | 7/2019 | Chen et al. | |
| 10,361,243 B2 | 7/2019 | Mears et al. | |
| 10,367,028 B2 | 7/2019 | Chen et al. | |
| 10,367,064 B2 | 7/2019 | Rao | |
| 10,381,242 B2 | 8/2019 | Takeuchi | |
| 10,396,223 B2 | 8/2019 | Chen et al. | |
| 10,410,880 B2 | 9/2019 | Takeuchi | |
| 10,453,945 B2 | 10/2019 | Mears et al. | |
| 10,461,118 B2 | 10/2019 | Chen et al. | |
| 10,468,245 B2 | 11/2019 | Weeks et al. | |
| 10,529,757 B2 | 1/2020 | Chen et al. | |
| 10,529,768 B2 | 1/2020 | Chen et al. | |
| 10,566,191 B1 | 2/2020 | Weeks et al. | |
| 10,580,866 B1 | 3/2020 | Takeuchi et al. | |
| 10,580,867 B1 | 3/2020 | Takeuchi et al. | |
| 10,593,761 B1 | 3/2020 | Takeuchi et al. | |
| 10,608,027 B2 | 3/2020 | Chen et al. | |
| 10,608,043 B2 | 3/2020 | Chen et al. | |
| 10,615,209 B2 | 4/2020 | Chen et al. | |
| 2001/0034130 A1 * | 10/2001 | Kusakabe | H01L 21/76224 438/694 |
| 2002/0064912 A1 * | 5/2002 | Komori | H01L 21/76232 438/221 |
| 2002/0070430 A1 * | 6/2002 | Oh | H01L 21/76229 257/622 |
| 2003/0022460 A1 * | 1/2003 | Park | H01L 21/76202 438/425 |
| 2003/0034529 A1 | 2/2003 | Fitzgerald et al. | |
| 2003/0038337 A1 * | 2/2003 | Kanamitsu | H01L 27/10855 257/510 |
| 2003/0057416 A1 | 3/2003 | Currie et al. | |
| 2003/0173641 A1 * | 9/2003 | Ohta | H01L 21/76224 257/510 |
| 2005/0282330 A1 | 12/2005 | Mears et al. | |
| 2006/0006462 A1 | 1/2006 | Chang et al. | |
| 2006/0208336 A1 | 9/2006 | Lee et al. | |
| 2006/0220118 A1 | 10/2006 | Stephenson et al. | |
| 2006/0267130 A1 | 11/2006 | Rao | |
| 2007/0012910 A1 | 1/2007 | Mears et al. | |
| 2007/0020833 A1 | 1/2007 | Mears et al. | |
| 2007/0042564 A1 | 2/2007 | Yoon | |
| 2007/0155128 A1 | 7/2007 | Choi | |
| 2007/0161218 A1 * | 7/2007 | Ichinose | H01L 21/823475 438/519 |
| 2007/0161253 A1 * | 7/2007 | Jang | H01L 21/76224 438/745 |
| 2008/0012004 A1 | 1/2008 | Huang et al. | |

(56) References Cited

U.S. PATENT DOCUMENTS

| | | | |
|---|---|---|---|
| 2008/0160720 A1 | 7/2008 | Ryu et al. | |
| 2008/0258134 A1 | 10/2008 | Mears et al. | |
| 2008/0258238 A1* | 10/2008 | Rogers | H01L 21/02164 257/397 |
| 2009/0000649 A1* | 1/2009 | Lee | C11D 11/0047 134/28 |
| 2009/0011566 A1* | 1/2009 | Okada | H01L 21/76224 438/308 |
| 2011/0215299 A1 | 9/2011 | Rao | |
| 2015/0024600 A1* | 1/2015 | Li | H01L 21/0206 438/696 |
| 2015/0357414 A1 | 12/2015 | Mears | |
| 2016/0149023 A1 | 5/2016 | Mears et al. | |
| 2016/0336406 A1 | 11/2016 | Mears et al. | |
| 2016/0358773 A1 | 12/2016 | Mears et al. | |
| 2018/0175143 A1* | 6/2018 | Yoon | H01L 29/0649 |
| 2018/0358361 A1 | 12/2018 | Rao | |
| 2019/0006229 A1* | 1/2019 | Julien | H01L 21/76224 |
| 2019/0057896 A1 | 2/2019 | Stephenson et al. | |
| 2019/0058059 A1 | 2/2019 | Stephenson et al. | |
| 2019/0189652 A1 | 6/2019 | Chen et al. | |
| 2019/0279869 A1 | 9/2019 | Weeks et al. | |
| 2019/0279897 A1 | 9/2019 | Stephenson et al. | |
| 2019/0280090 A1 | 9/2019 | Stephenson et al. | |
| 2019/0317277 A1 | 10/2019 | Stephenson | |
| 2019/0319135 A1 | 10/2019 | Stephenson | |
| 2019/0319136 A1 | 10/2019 | Stephenson | |
| 2019/0319167 A1 | 10/2019 | Stephenson | |
| 2020/0075731 A1 | 3/2020 | Weeks et al. | |
| 2020/0144064 A1* | 5/2020 | Liu | H01L 21/823807 |

OTHER PUBLICATIONS

U.S. Appl. No. 16/192,897, filed Nov. 16, 2018 Connelly et al.
U.S. Appl. No. 16/192,911, filed Nov. 16, 2018 Takeuchi et al.
U.S. Appl. No. 16/192,923, filed Nov. 16, 2018 Takeuchi et al.
U.S. Appl. No. 16/192,987, filed Nov. 16, 2018 Takeuchi et al.
U.S. Appl. No. 16/193,000, filed Nov. 16, 2018 Takeuchi et al.
U.S. Appl. No. 16/193,011, filed Nov. 16, 2018 Takeuchi et al.
U.S. Appl. No. 16/513,528, filed 17/17/2019; Burton et al.
U.S. Appl. No. 16/513,832, filed 17/17/2019 Burton et al.
U.S. Appl. No. 16/513,845, filed 17/17/2019 Burton et al.
U.S. Appl. No. 16/513,875, filed 17/17/2019 Burton et al.
U.S. Appl. No. 16/513,895, filed 17/17/2019 Burton et al.
U.S. Appl. No. 16/513,906, filed 17/17/2019 Burton et al.
U.S. Appl. No. 16/513,932, filed 17/17/2019 Burton et al.
U.S. Appl. No. 16/513,943, filed 17/17/2019 Burton et al.
U.S. Appl. No. 16/801,287, filed Feb. 26, 2020 Weeks et al.
U.S. Appl. No. 16/801,305, filed Feb. 26, 2020 Weeks et al.
U.S. Appl. No. 16/810,957, filed Mar. 6, 2020 Cody et al.
U.S. Appl. No. 16/853,875, filed Apr. 21, 2020 Hideki Takeuchi.
U.S. Appl. No. 16/853,884, filed Apr. 21, 2020 Hideki Takeuchi.
U.S. Appl. No. 16/898,589, filed Jun. 11, 2020 Takeuchi et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) p. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.
R. Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, p. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.

* cited by examiner

METHOD FOR MAKING SEMICONDUCTOR DEVICE INCLUDING A SUPERLATTICE AND PROVIDING REDUCED GATE LEAKAGE

TECHNICAL FIELD

The present disclosure generally relates to semiconductor devices and, more particularly, to methods for making semiconductor devices with enhanced semiconductor materials.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2/Si$ with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a plurality of shallow trench isolation (STI) regions in a semiconductor substrate defining an active region therebetween in the semiconductor substrate and a pad oxide on the active region. The method may further include removing at least some of the pad oxide, cleaning the active region to expose an upper surface thereof and define rounded shoulders of the active region adjacent the STI regions having an interior angle of at least 125°, and forming a superlattice on the active region. The superlattice may comprise a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions. The method may further include forming a semiconductor circuit including the superlattice.

More particularly, forming the semiconductor circuit may include forming spaced apart source and drain regions in the semiconductor substrate defining a channel therebetween prior to forming the superlattice, and forming a gate overlying the superlattice and the channel comprising a gate dielectric overlying the superlattice and a gate electrode overlying the gate dielectric layer. In an example embodiment, a thickness of the gate oxide may vary less than 10% along a length thereof. In accordance with another example embodiment, the rounded shoulders of the active region have an interior angle of at least 135°.

By way of example, removing at least some of the pad oxide may comprise stopping oxide removal before a level of the pad oxide reaches the upper surface of the active region. In accordance with another example, removing at least some of the pad oxide may comprise removing 30% or less of a thickness of the pad oxide on the active region.

The method may further include forming a well implant in the semiconductor substrate prior to removing the portion of the STI regions. By way of example, the base semiconductor monolayers may comprise silicon monolayers, and the at least one non-semiconductor monolayer may comprise oxygen.

DETAILED DESCRIPTION

Figure 1:
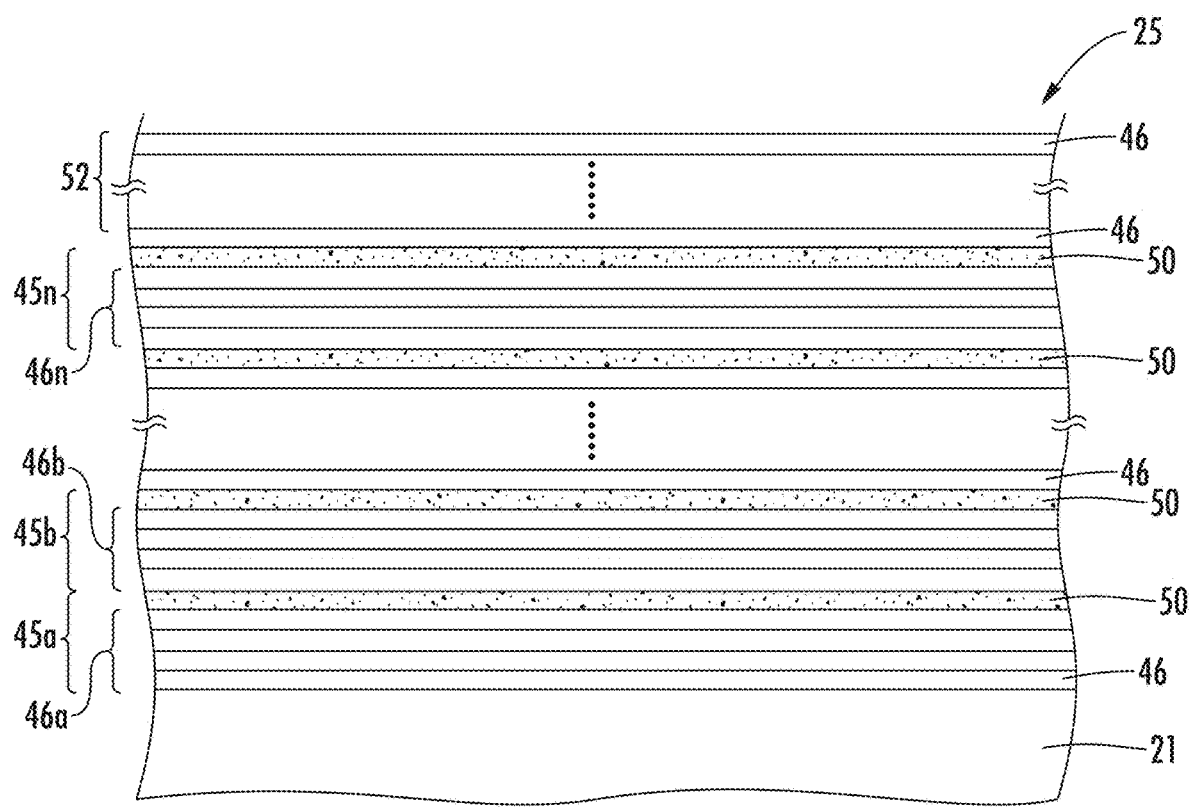
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice is also referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3k}{\sum_{E>E_F} \int_{B.Z.} f(E(k, n), E_F, T) d^3k}$$

for electrons and:

$$M_{h,ij}^{-1}(E_F, T) = \frac{-\sum_{E<E_F} \int_{B.Z.} (\nabla_k E(k, n))_i (\nabla_k E(k, n))_j \frac{\partial f(E(k, n), E_F, T)}{\partial E} d^3k}{\sum_{E<E_F} \int_{B.Z.} (1 - f(E(k, n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
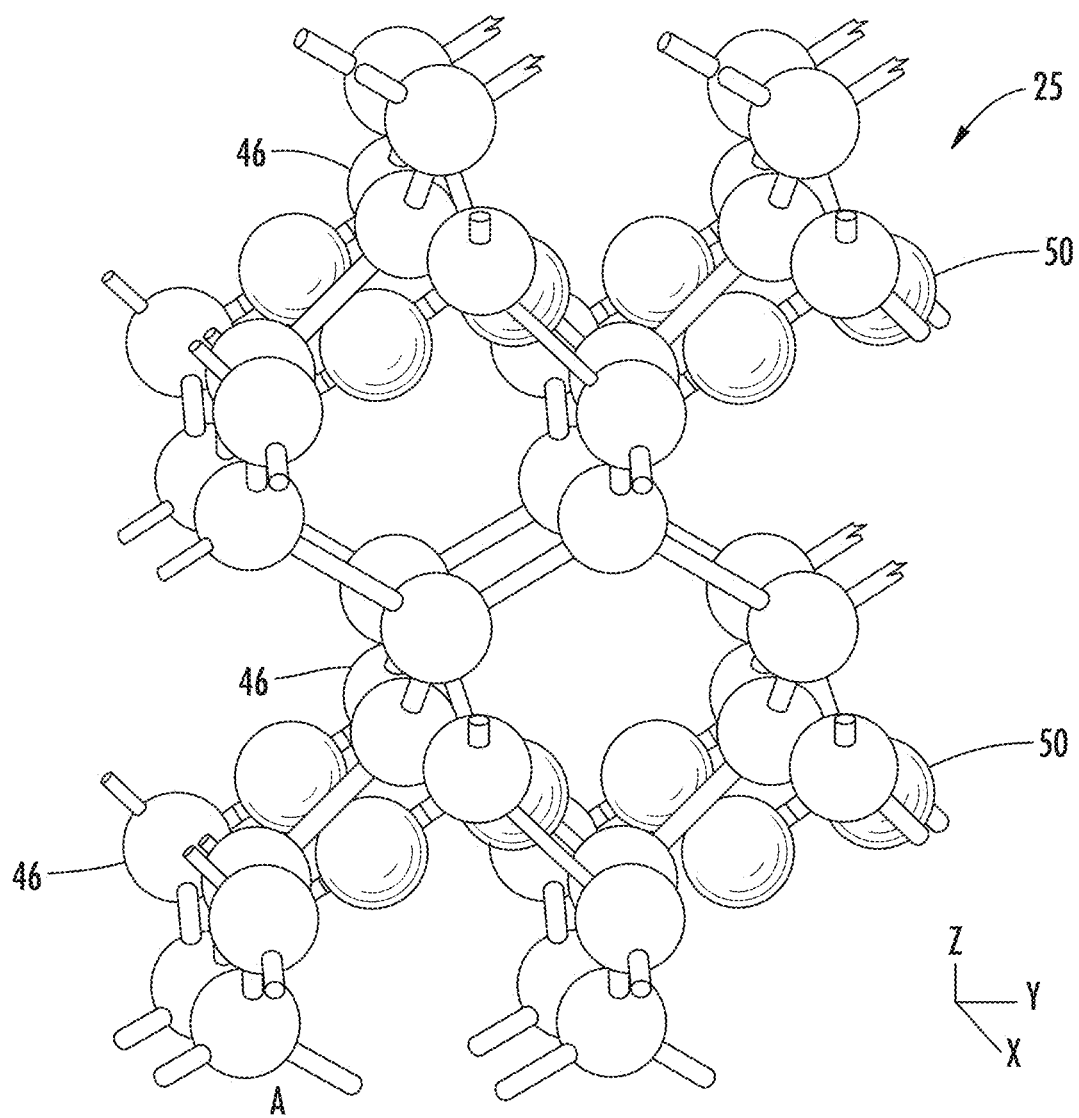
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
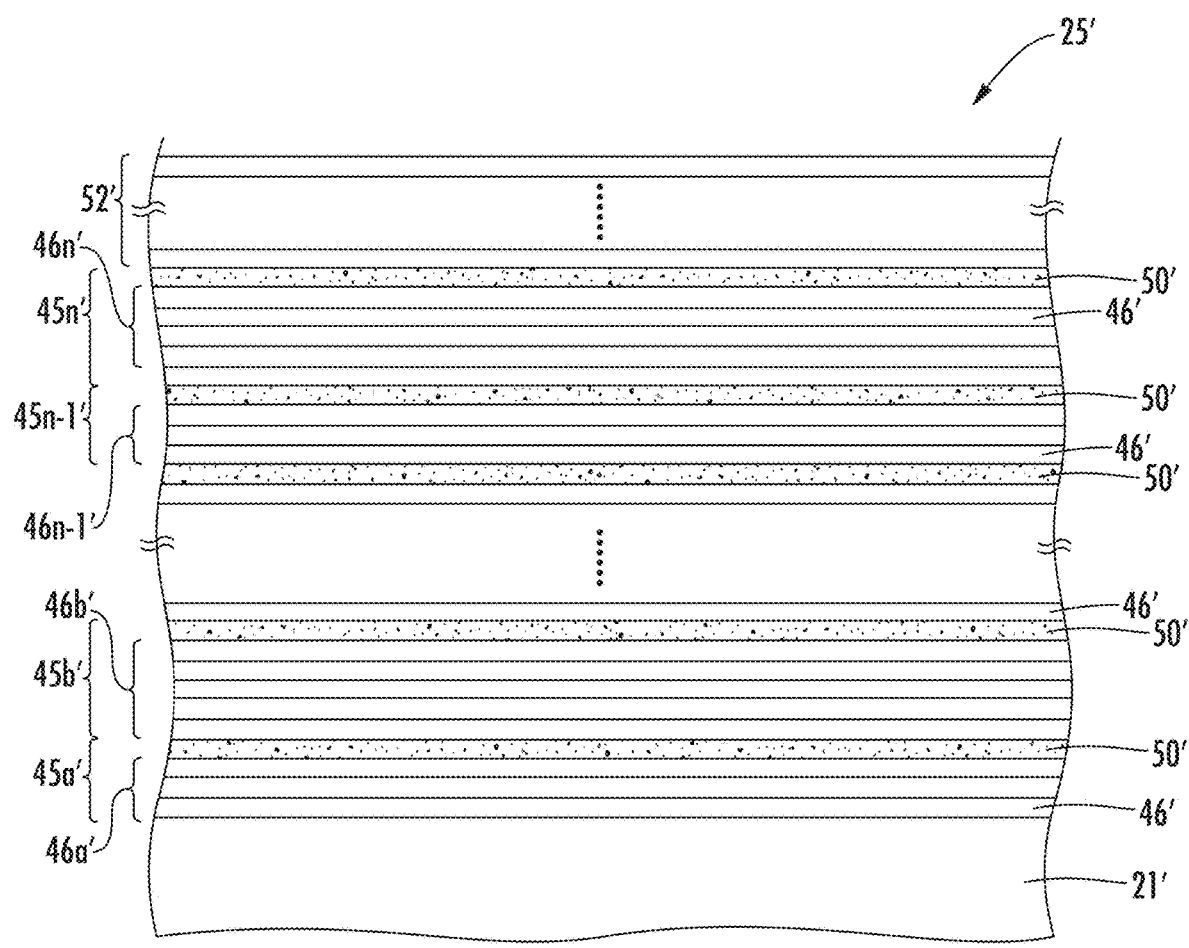
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
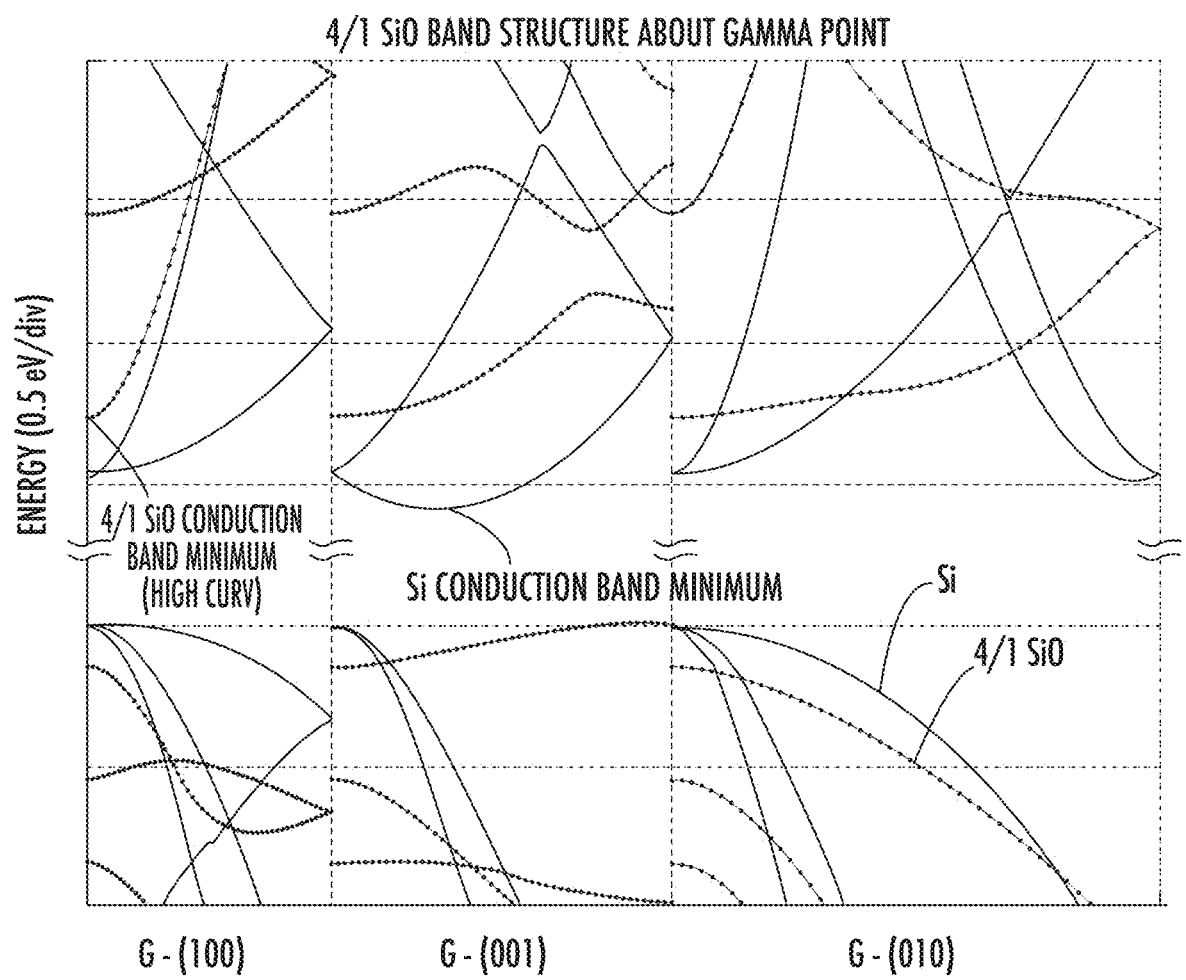
FIG. 4A is a graph of the calculated band structure from the gamma point (G) for both bulk silicon as in the prior art, and for the 4/1 Si/O superlattice as shown in FIGS. 1-2.
Figure 4B:
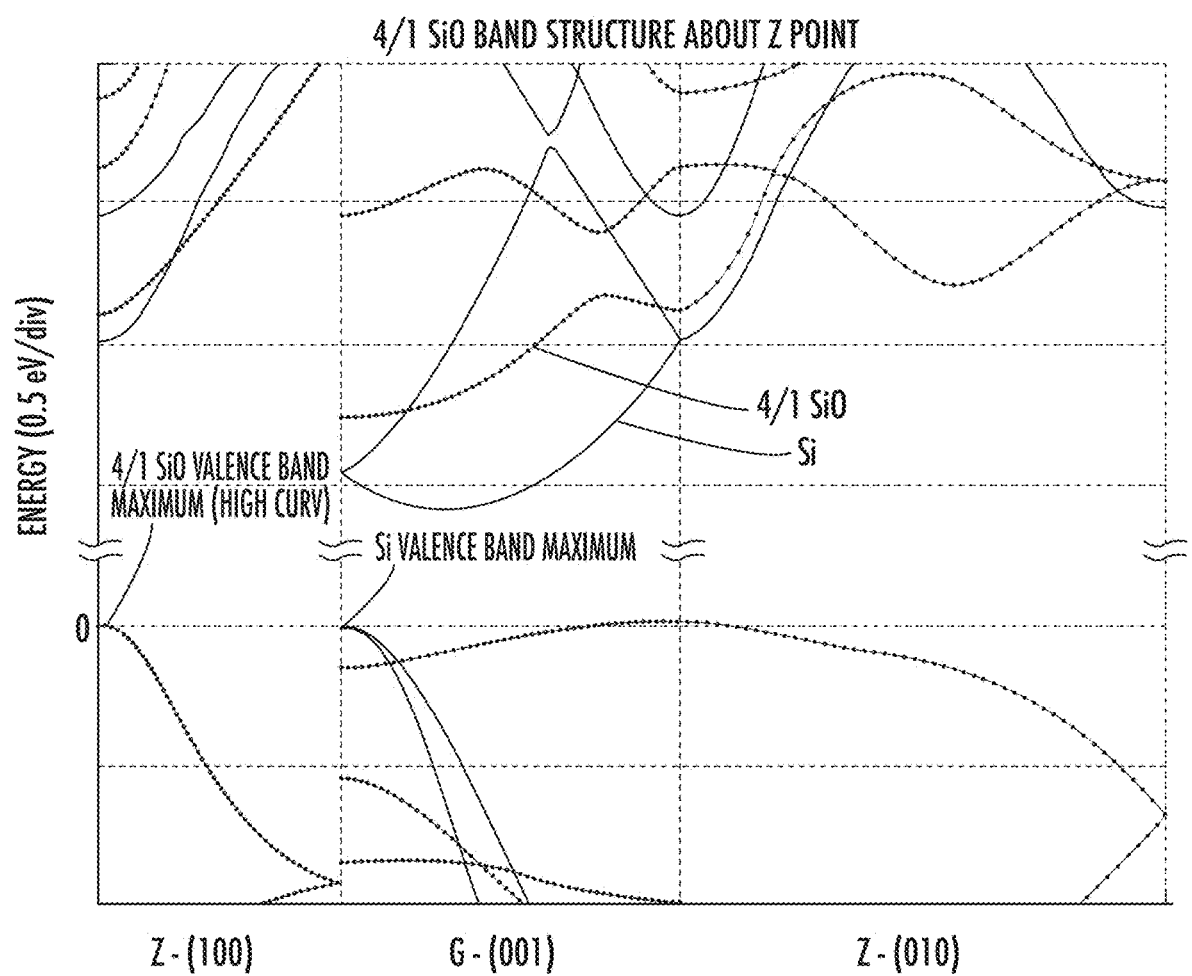
FIG. 4B is a graph of the calculated band structure from the Z point for both bulk silicon as in the prior art, and for the 4/1 Si/O superlattice as shown in FIGS. 1-2.
Figure 4C:
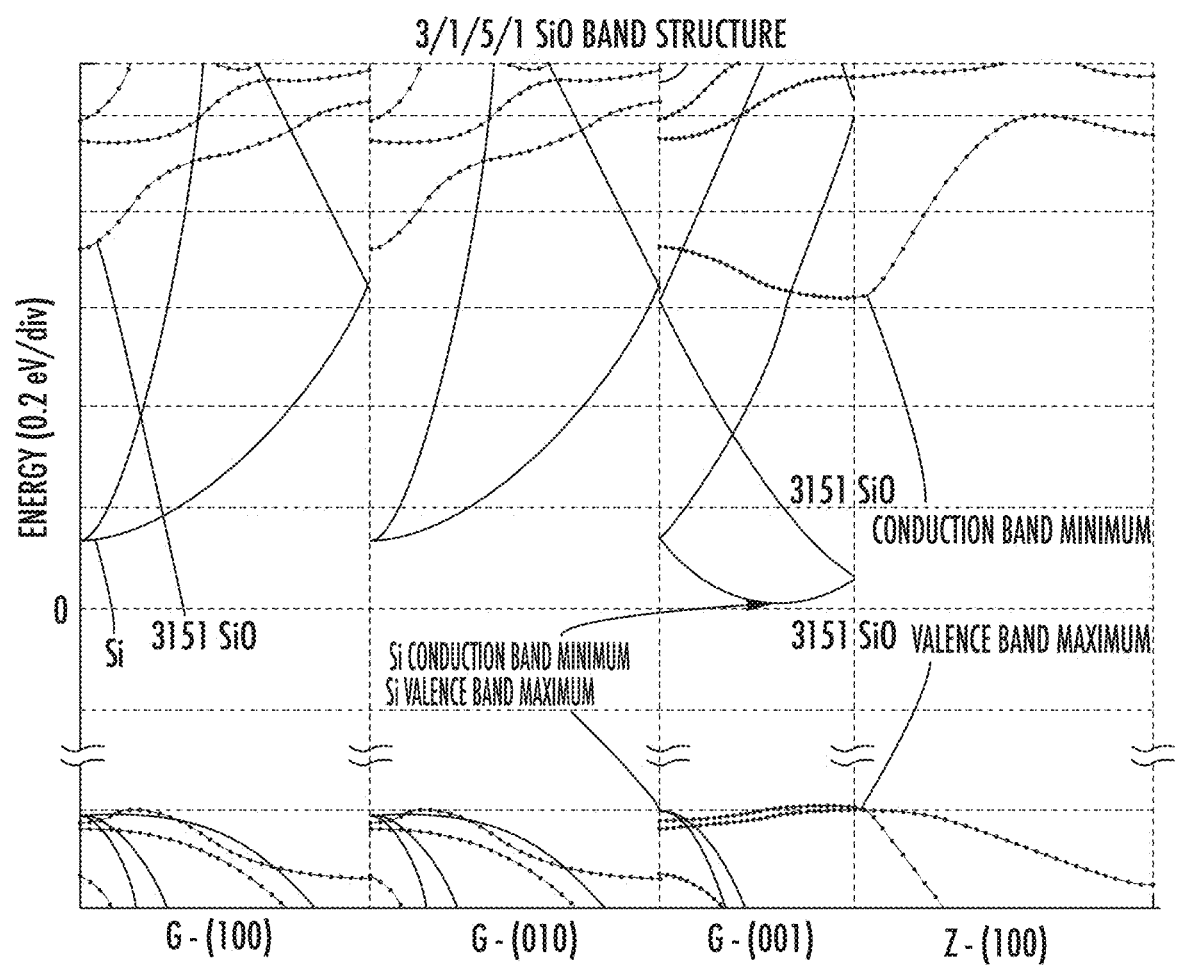
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
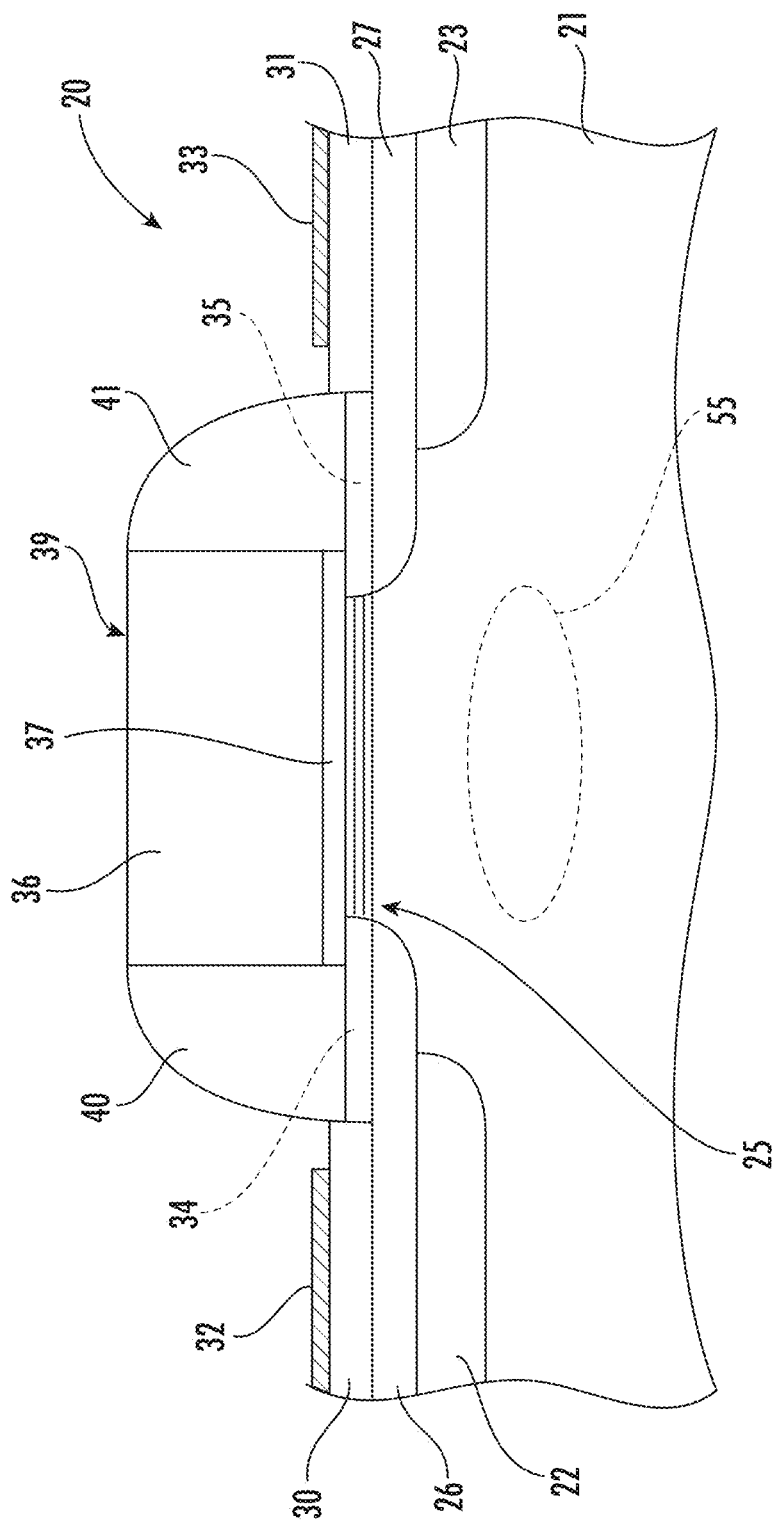
FIG. 5 is a schematic block diagram of a semiconductor device in accordance with an example embodiment including a superlattice for enhanced mobility and rounded active edge shoulders to provide decreased gate leakage.

An example approach for fabricating semiconductor devices such as a planar MOSFET 20 shown in FIG. 5 including the above-described superlattice 25 is now described which may advantageously provide for reduced gate leakage. One skilled in the art, however, will appreciate that the techniques identified herein may be used in many different types of semiconductor devices, such as discrete devices and/or integrated circuits, for example. The illustrated MOSFET 20 includes the substrate 21 having a well implant 55 therein, source/drain regions 22, 23, source/drain extensions 26, 27, and a channel region therebetween, which may be provided at least partially within the superlattice 25. Source/drain silicide layers 30, 31 and source/drain contacts 32, 33 overlie the source/drain regions 22, 23 as will be appreciated by those skilled in the art. Regions indicated by dashed lines 34, 35 are optional vestigial portions formed originally with the superlattice 25, but thereafter heavily doped. In other embodiments, these vestigial superlattice regions 34, 35 may not be present, as will also be appreciated by those skilled in the art. A gate 39 illustratively includes a gate insulating layer 37 adjacent the channel provided by the superlattice 25, and a gate electrode layer 36 on the gate insulating layer. Sidewall spacers 40, 41 are also provided in the illustrated MOSFET 20. Using the fabrication techniques discussed further below, shoulders of the active region of the substrate 21 upon which the superlattice 25 is formed may be created with relatively large angles of 135° or more to advantageously provide significantly reduced gate leakage.

Figure 6:
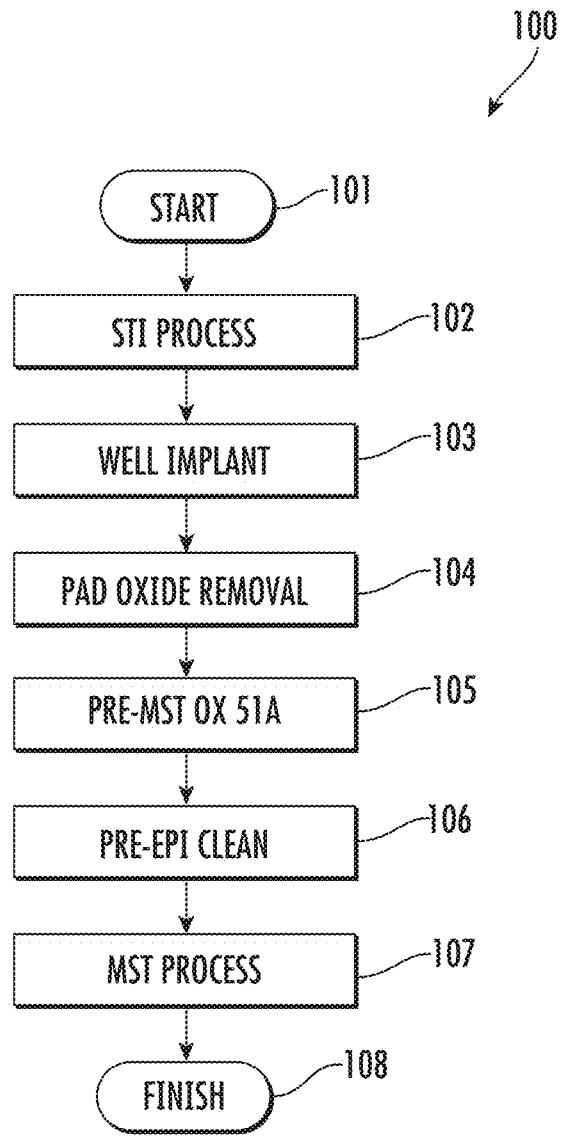
FIG. 6 is a flow diagram illustrating a method of making a semiconductor device in accordance with the prior art.
Figure 7:
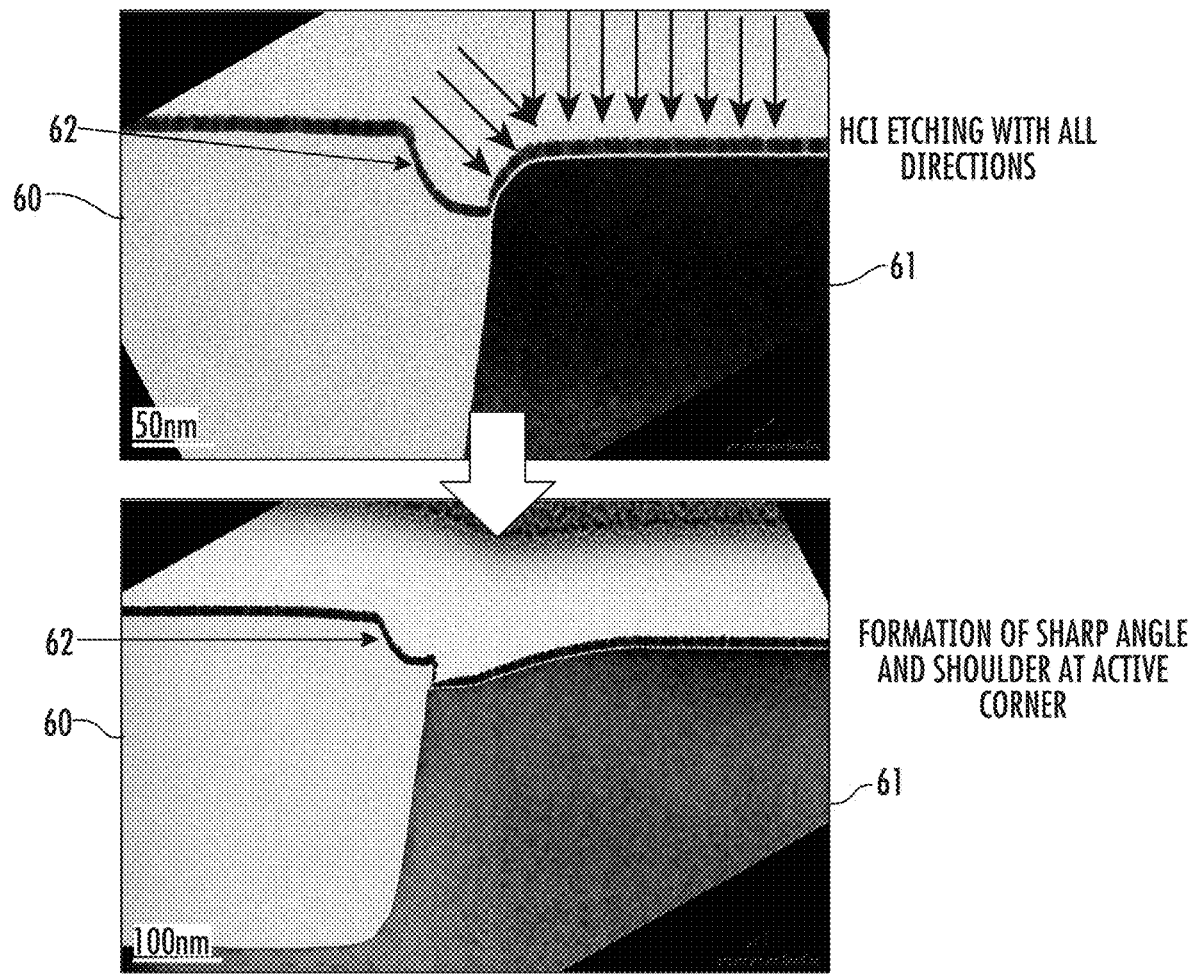
FIGS. 7 and 8 are a series of transmission electron microscopy (TEM) images taken during fabrication of a semiconductor device in accordance with the prior art method of FIG. 6.
Figure 8:
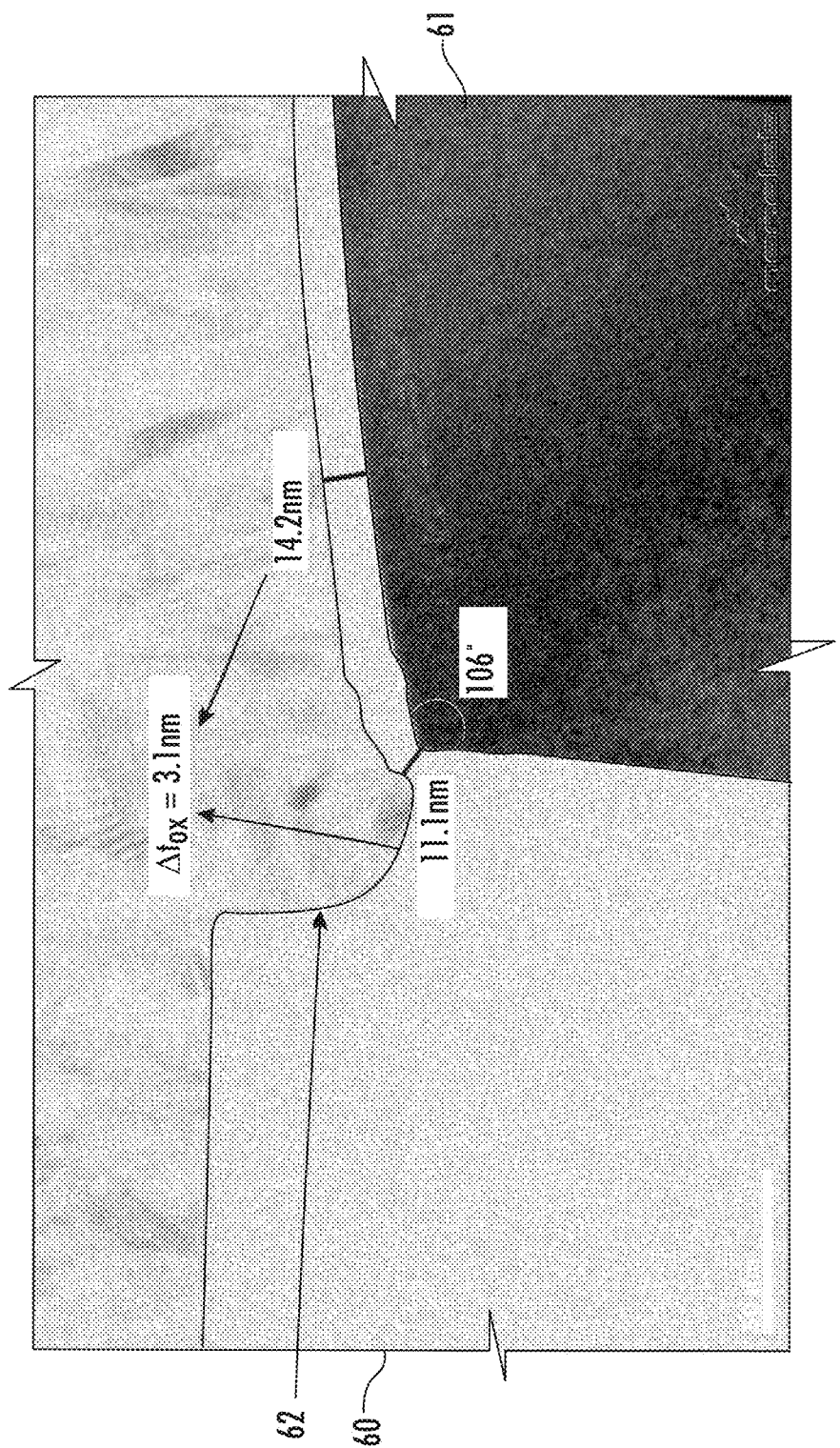

Referring additionally to the flow diagram 100 of FIG. 6 and FIGS. 7-8, a typical fabrication flow begins (Block 101) with the formation of shallow trench isolation (STI) regions formation, at Block 102. In a Local Oxidation of Silicon (LOCOS) process, for example, initially a very thin pad oxide layer is grown on an active semiconductor region or area 61. Then, a layer of silicon nitride is deposited which is used as an oxide barrier. A pattern transfer is performed by photolithography, and after lithography the pattern is etched into the nitride to create a mask which defines the active regions 61 for the oxidation process (STI formation). After growth of STI regions 60 through the oxidation process, the nitride layer is removed.

In preparation for fabricating the semiconductor device 50, a well implant may optionally be formed in the active region 61 (Block 103), and the pad oxide is removed from the surface of the active region, at Block 104. In the example process, a pre-MST film oxidation step is then performed (here a 51A oxidation), at Block 105, followed by a pre-MST deposition cleaning (Block 106), such as with HCl, which ends the illustrated process (Block 108). Of course, further device fabrication steps may then be performed (e.g., source/drain 22, 23 and gate 39 formation, etc.).

A problem may arise with the above-described approach. More particularly, the typical pad oxide removal step (Block 104) results in a divot 62 in the STI regions 60 directly adjacent the active region 61 that dips down below the upper surface of the active region around the shoulder or corner thereof, as seen in the top image in FIG. 7. By way of example, the pad oxide removal step may utilize an etchant such as DHF, HF, LL130, etc., to control the oxide thickness after etching, e.g., in a range of 15 to 30 Å. HCl gas is then used for the pre-clean prior to the selective epitaxial growth (SEG) for the superlattice 25 to remove undesired deposits from the previously deposited oxide and/or nitride. Yet, because of the divot 62 created by the prior pad oxide removal, the HCl pre-clean etch not only etches the upper surface of the active region 61 as intended, but also etches down and around the side of the active region (as indicated by the multi-directional arrows in FIG. 7).

This accordingly results in the formation of a relatively sharp shoulder angle at the active region 61 corner (106° in the present example), as seen in the lower image in FIG. 7. Moreover, this sharp angle results in a relatively large differential ($\Delta t_{ox}$) in thickness of the gate oxide layer 137 overlying an MST superlattice 125 at the corner of the active region 61 (11.1 nm) compared to portions further towards the middle of the active region (14.2 nm). In the illustrated example, the $\Delta t_{ox}$ is 3.1 nm, or 21.8%. This causes an active-corner gate leakage that is relatively high, and the TEM images of devices fabricated using this approach reveal that it is the relatively sharp corner angles (approaching 90 degrees) that cause gate oxide thinning at the active corners, as in the prior art example.

Figure 9:
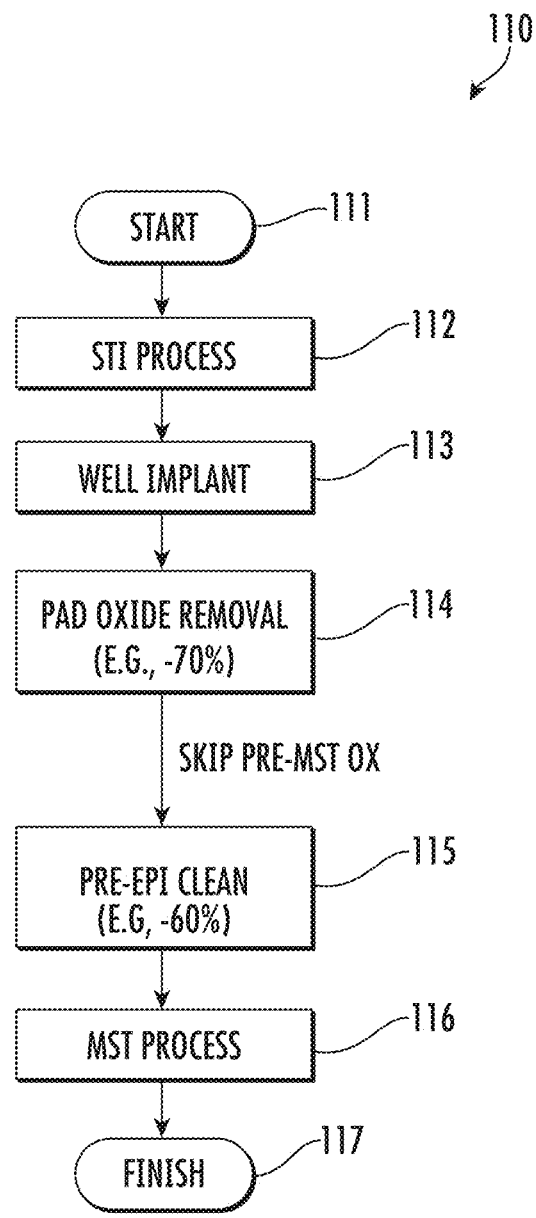
FIG. 9 is a flow diagram illustrating the method of making a semiconductor device in accordance with an example embodiment.
Figure 10:
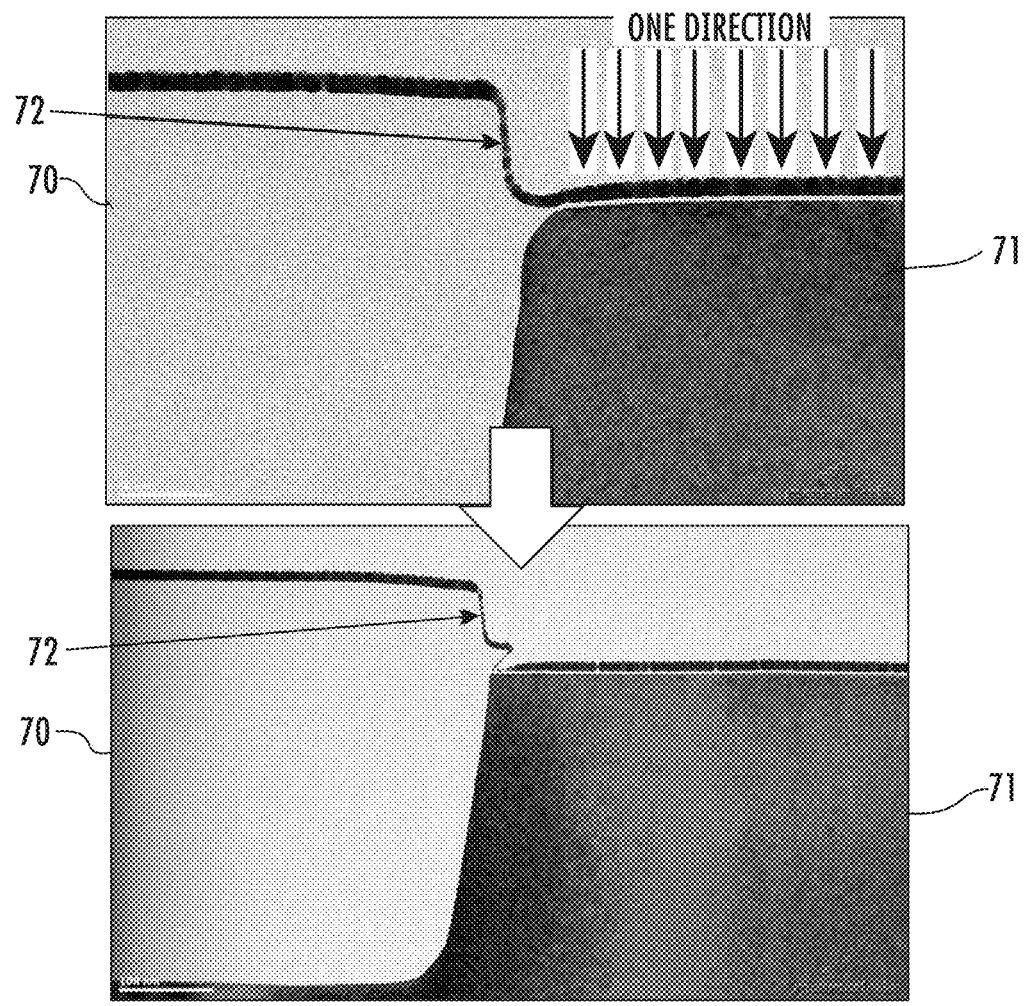
FIGS. 10 and 11 are a series of TEM images taken during fabrication of a semiconductor device in accordance with the method of FIG. 9.
Figure 11:
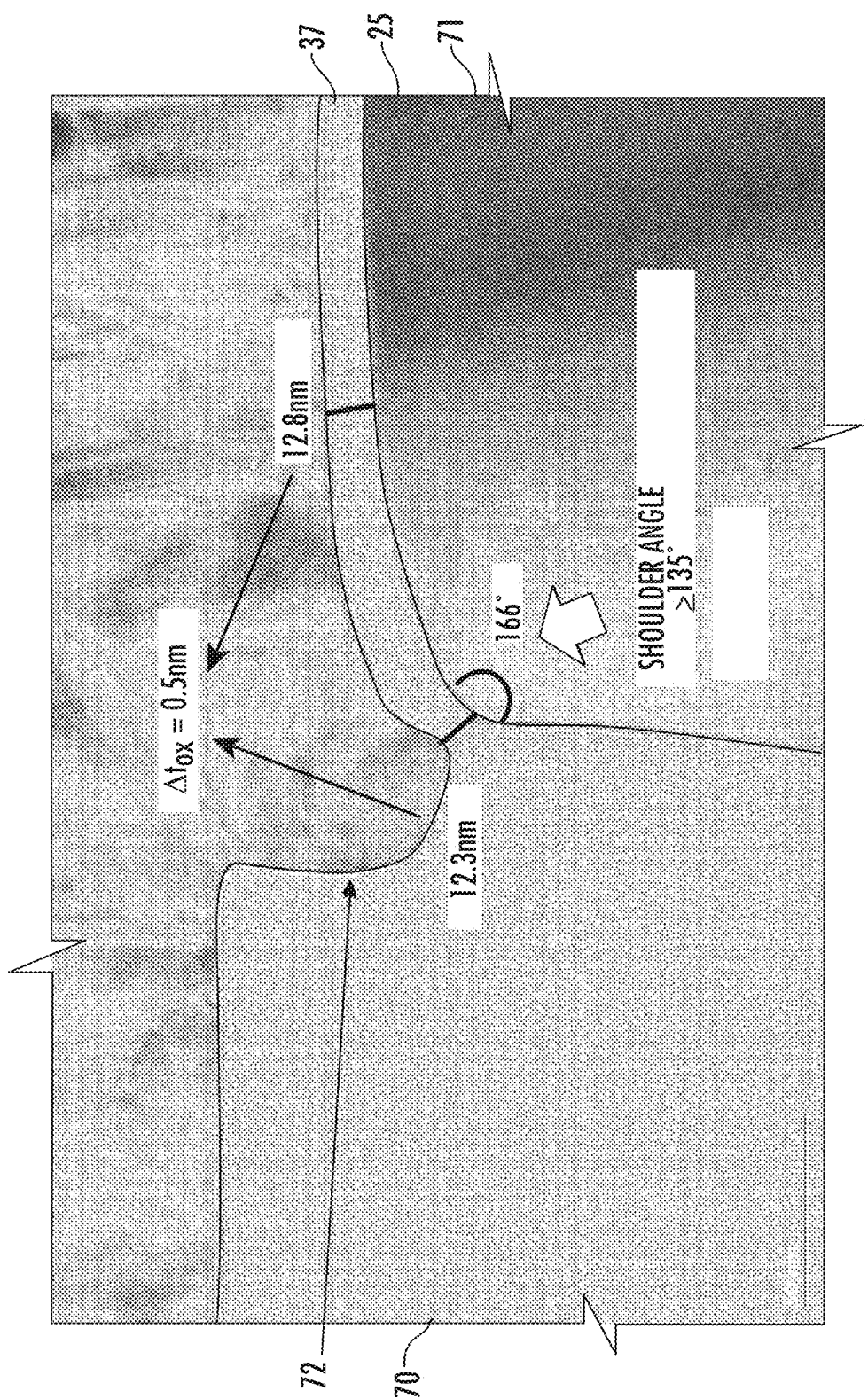

A process flow in accordance with an example embodiment and associated TEM images are now described with reference to the flow diagram 110 of FIG. 9 and FIGS. 10-11. Beginning at Block 111, the STI and well implant formation (Block 112-113) are the same as described above. However, for the pad oxide removal (Block 114), a less aggressive etch is performed in that less than the full amount of the pad oxide on the active semiconductor region or area 71 is removed. In the illustrated method, the pad oxide reduction is decreased by about 70% relative to the above-described approach (i.e., only 30% or less of the pad oxide is removed), although other amounts may be removed in different embodiments. In the illustrated example, approximately 120 Å of pad oxide was removed, compared to approximately 500 Å in the example of FIGS. 7-8. As seen in the top image in FIG. 10, the resulting divot 72 at the shoulder of the active region 71 where it meets the STI region 70 does not dip below the upper surface of the active region.

Since not all of the pad oxide is removed, the previously described pre-MST oxidation step (Block 105 of FIG. 6) may accordingly be omitted from the present process flow. And when the HCl etchant used for the pre-EPI clean (Block 115) occurs, the etch will only "attack" the active region 71 from one direction (i.e., from the top down and not from the sides, as shown in FIG. 8). Moreover, a shorter HCl pre-clean may be used, e.g., 60% less than in the above-described approach. As seen in FIG. 11, the result is that the HCl etchant does not etch the shoulder from the side, and thus the original rounded shape of the shoulder is retained to provide a larger shoulder angle, which may be greater than or equal to 135°, for example. In the illustrated embodiment, a shoulder angle of 166° is achieved. Additionally, a much lower $\Delta t_{ox}$ at the corner (12.3 nm) compared to portions further towards the middle of the active region 61 (12.8 nm) is also achieved, which in the present example is 0.5 nm, or 3.9%. Generally speaking, it is desirable to maintain $\Delta t_{ox}$ of less than about 10% (which is roughly 30 Å in the present example, but will be different for different devices), which as demonstrated in the illustrated embodiment is readily achievable with the present process.

Furthermore, semiconductor devices fabricated using this process have demonstrated a significant reduction in gate leakage in planar MOSFET devices such as the MOSFET 20. Experimental devices demonstrated anywhere from 2,000 to 10,000 times reduction in gate edge leakage for different MST film types through the use of the above-described STI divot control techniques. Moreover, this approach also provides for a flatter active region 71 by a factor of three times or more relative to the process of FIG. 6.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming a plurality of shallow trench isolation (STI) regions in a semiconductor substrate defining an active region therebetween in the semiconductor substrate and a pad oxide on the active region;
   removing at least some of the pad oxide leaving a thinned pad oxide portion on the active region while preventing divot formation in the STI regions directly adjacent the active region;
   with the thinned pad oxide portion on the active region, cleaning the active region from the top down and not from the sides to expose an upper surface thereof and define a single rounded shoulder of the active region adjacent each STI region having an interior angle of at least 125° measured from an upper surface of the active region to a vertical sidewall of the active region;
   forming a superlattice on the active region comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions; and forming a semiconductor circuit including the superlattice.

2. The method of claim 1 wherein forming the semiconductor circuit comprises:

forming spaced apart source and drain regions in the semiconductor substrate defining a channel therebetween prior to forming the superlattice; and forming a gate overlying the superlattice and the channel comprising a gate dielectric layer overlying the superlattice, and a gate electrode overlying the gate dielectric layer.

3. The method of claim 2 wherein a thickness of the gate oxide varies less than 10% along a length thereof.

4. The method of claim 1 wherein the rounded shoulders of the active region have an interior angle of at least 135°.

5. The method of claim 1 wherein removing at least some of the pad oxide comprises removing 30% or less of a thickness of the pad oxide on the active region.

6. The method of claim 1 further comprising forming a well implant in the semiconductor substrate prior to removing the portion of the STI regions.

7. The method of claim 1 wherein the base semiconductor monolayers comprise silicon monolayers.

8. The method of claim 1 wherein the at least one non-semiconductor monolayer comprises oxygen.

9. A method for making a semiconductor device comprising:

forming a plurality of shallow trench isolation (STI) regions in a semiconductor substrate defining an active region therebetween in the semiconductor substrate;

forming a well implant in the semiconductor substrate;

forming a pad oxide on the active region;

removing at least some of the pad oxide leaving a thinned pad oxide portion on the active region while preventing divot formation in the STI regions directly adjacent the active region;

with the thinned pad oxide portion on the active region, cleaning the active region from the top down and not from the sides to expose an upper surface thereof and define a single rounded shoulder of the active region adjacent each STI region having an interior angle of at least 125° measured from an upper surface of the active region to a vertical sidewall of the active region;

forming a superlattice on the active region comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions; and forming a semiconductor circuit including the superlattice by forming spaced apart source and drain regions in the semiconductor substrate defining a channel therebetween prior to forming the superlattice, and forming a gate overlying the superlattice and the channel comprising a gate dielectric layer overlying the superlattice, and a gate electrode overlying the gate dielectric layer.

10. The method of claim 9 wherein a thickness of the gate oxide varies less than 10% along a length thereof.

11. The method of claim 9 wherein the rounded shoulders of the active region have an interior angle of at least 135°.

12. The method of claim 9 wherein removing at least some of the pad oxide comprises removing 30% or less of a thickness of the pad oxide on the active region.

13. A method for making a semiconductor device comprising:

forming a plurality of shallow trench isolation (STI) regions in a semiconductor substrate defining an active region therebetween in the semiconductor substrate and a pad oxide on the active region;

removing at least some of the pad oxide leaving a thinned pad oxide portion on the active region while preventing divot formation in the STI regions directly adjacent the active region;

with the thinned pad oxide portion on the active region, cleaning the active region from the top down and not from the sides to expose an upper surface thereof and define a single rounded shoulder of the active region adjacent each STI region having an interior angle of at least 125° measured from an upper surface of the active region to a vertical sidewall of the active region;

forming a superlattice on the active region comprising a plurality of stacked groups of layers, each group of layers comprising a plurality of stacked base silicon monolayers defining a base silicon portion, and at least one oxygen monolayer constrained within a crystal lattice of adjacent base silicon portions; and forming a semiconductor circuit including the superlattice.

14. The method of claim 13 wherein forming the semiconductor circuit comprises:

forming spaced apart source and drain regions in the semiconductor substrate defining a channel therebetween prior to forming the superlattice; and forming a gate overlying the superlattice and the channel comprising a gate dielectric layer overlying the superlattice, and a gate electrode overlying the gate dielectric layer.

15. The method of claim 14 wherein a thickness of the gate oxide varies less than 10% along a length thereof.

16. The method of claim 13 wherein the rounded shoulders of the active region have an interior angle of at least 135°.

17. The method of claim 13 wherein removing at least some of the pad oxide comprises removing 30% or less of a thickness of the pad oxide on the active region.

18. The method of claim 13 further comprising forming a well implant in the semiconductor substrate prior to removing the portion of the STI regions.

* * * * *